United States Patent [19]
Nakamura

[11] Patent Number: 5,755,373
[45] Date of Patent: May 26, 1998

[54] DIE PUSH-UP DEVICE

[75] Inventor: Osamu Nakamura, Kokubunji, Japan

[73] Assignee: Kabushiki Kaisha Shinkawa, Tokyo, Japan

[21] Appl. No.: 698,668

[22] Filed: Aug. 16, 1996

[30]     Foreign Application Priority Data

Aug. 18, 1995  [JP]  Japan .................. 7-232110

[51] Int. Cl.$^6$ ........................ H05K 3/30
[52] U.S. Cl. ......................... 228/6.2; 228/49.5
[58] Field of Search .................. 228/6.2, 44.7, 228/49.5; 29/740, 743

[56]         References Cited

U.S. PATENT DOCUMENTS 4,599,037  7/1986  Ross, Jr., et al. .......... 414/752

FOREIGN PATENT DOCUMENTS 3-40502  6/1991  Japan ............. H01L 21/52
3-54858  8/1991  Japan ............. H01L 21/68

Primary Examiner—Samuel M. Heinrich
Attorney, Agent, or Firm—Koda & Androlia

[57]           ABSTRACT

A die push-up device used in a bonding machine for semiconductor devices, etc. including a wafer sheet suction assembly and a wafer push-up needle which are moved up and down independently by a suction assembly raising-and-lowering cam and a push-up needle raising-and-lowering cam which are respectively rotated by a suction assembly raising-and-lowering motor and a push-up needle raising-and-lowering motor.

3 Claims, 3 Drawing Sheets

DIE PUSH-UP DEVICE

BACKGROUND OF THE INVENTION

1. Field of the Invention

The present invention relates to a die push-up device used in a bonding apparatus such as a die bonding apparatus, tape bonding apparatus, etc.

2. Prior Art

For example, a die bonding apparatus includes a wafer ring holder which holds the wafer ring of a semiconductor workpiece (described below) in a freely detachable manner, an XY movement device which is driven in the X and Y directions and to which the wafer ring holder is fastened, a suction chucking nozzle installed above the wafer ring holder, and a die push-up device provided beneath the wafer ring holder.

Each of the semiconductor workpieces which are set on the wafer ring holder consists of a wafer sheet (with adhesively attached dies) which is pasted to a wafer ring. In addition, the die push-up device includes a suction assembly, which holds the wafer sheet by vacuum suction, and a push-up needle, which is installed inside the suction assembly so as to push the dies on the wafer sheet upward while the wafer sheet is held in place by the suction assembly.

Accordingly, dies on the wafer sheet are pushed upward by the push-up needle, and the dies thus pushed upward are suction-held and then transferred by the suction chucking nozzle.

A die bonding apparatus of this type is disclosed in, for example, Japanese Patent Application Publication (Kokoku) Nos. 3-40502 and 3-54858.

In a typical die push-up device, a wafer ring to which the wafer sheet is pasted is first moved in the X and Y directions so that the die that is to be picked up is positioned in the pick-up position above the push-up needle. Accordingly, a slight gap is provided between the suction assembly and the wafer ring. After the die that is to be picked up has been positioned in the pick-up position, the suction assembly holds the wafer sheet in place by vacuum suction, and the push-up needle is pushed upward.

The suction assembly described above functions so as to hold the wafer sheet in place by vacuum suction when the die is pushed upward by the push-up needle, so that the separation of the die from the wafer sheet is facilitated. Accordingly, it is preferable that the suction assembly be adjusted so as to contact the wafer sheet.

However, as described above, the wafer sheet is moved in the X and Y directions so that the die that is to be picked up is positioned. Accordingly, if the suction assembly is adjusted so as to contact the wafer sheet, the suction assembly has a deleterious effect on the wafer sheet. On the other hand, if the gap between the wafer sheet and the suction assembly is increased in order to facilitate movement of the wafer sheet, the suction holding capacity of the suction assembly is decreased.

SUMMARY OF THE INVENTION

Accordingly, the first object of the present invention is to provide a die push-up device in which the height of the suction assembly can easily be adjusted.

The second object of the present invention is to provide a die push-up device in which the suction assembly has no deleterious effect on the wafer sheet during the movement of the wafer sheet and in which the suction assembly has high suction holding capacity.

The third object of the present invention is to provide a die push-up device in which there is no relative positional variation between the suction assembly and the push-up needle even when the suction assembly is moved upward and downward.

The above objects, particularly the first and second objects, are accomplished by a unique structure for a die push-up device that includes a suction assembly, on which a wafer sheet to which dies are bonded is held by suction, and a push-up needle, which is installed inside the suction assembly so as to push the dies upward, and the unique structure of the present invention is that the suction assembly and the push-up needle are independently moved by a suction assembly raising-and-lowering cam and a push-up needle raising-and-lowering cam which are respectively rotated by a suction assembly raising-and-lowering motor and a push-up needle raising-and-lowering motor.

In addition, the objects, particularly the first through third objects described above, are accomplished by another unique structure for a die push-up device that includes a suction assembly, on which a wafer sheet to which dies are bonded is held by suction, and a push-up needle, which is installed inside the suction assembly so as to push the dies upward, and the unique structure of the present invention is that:

the suction assembly is provided on a suction assembly holder, a raising-and-lowering holder is attached to the suction assembly holder, the raising-and-lowering holder is moved upward and downward by a suction assembly raising-and-lowering cam which is rotated by a first motor, the push-up needle is fastened to a push-up needle raising-and-lowering shaft which is installed inside the suction assembly holder so as to move upward and downward by a holder lever which is pivotally provided on the raising-and-lowering holder, and the holder lever is moved upward and downward by a push-up needle raising-and-lowering cam which is pivoted by a second motor.

BRIEF DESCRIPTION OF THE DRAWINGS

FIG. 1 illustrates one embodiment of the die push-up device of the present invention, in which FIG. 1(a) is a sectional side view, and FIG. 1(b) is a sectional front view;

DETAILED DESCRIPTION OF THE PREFERRED EMBODIMENTS

Figure 1:
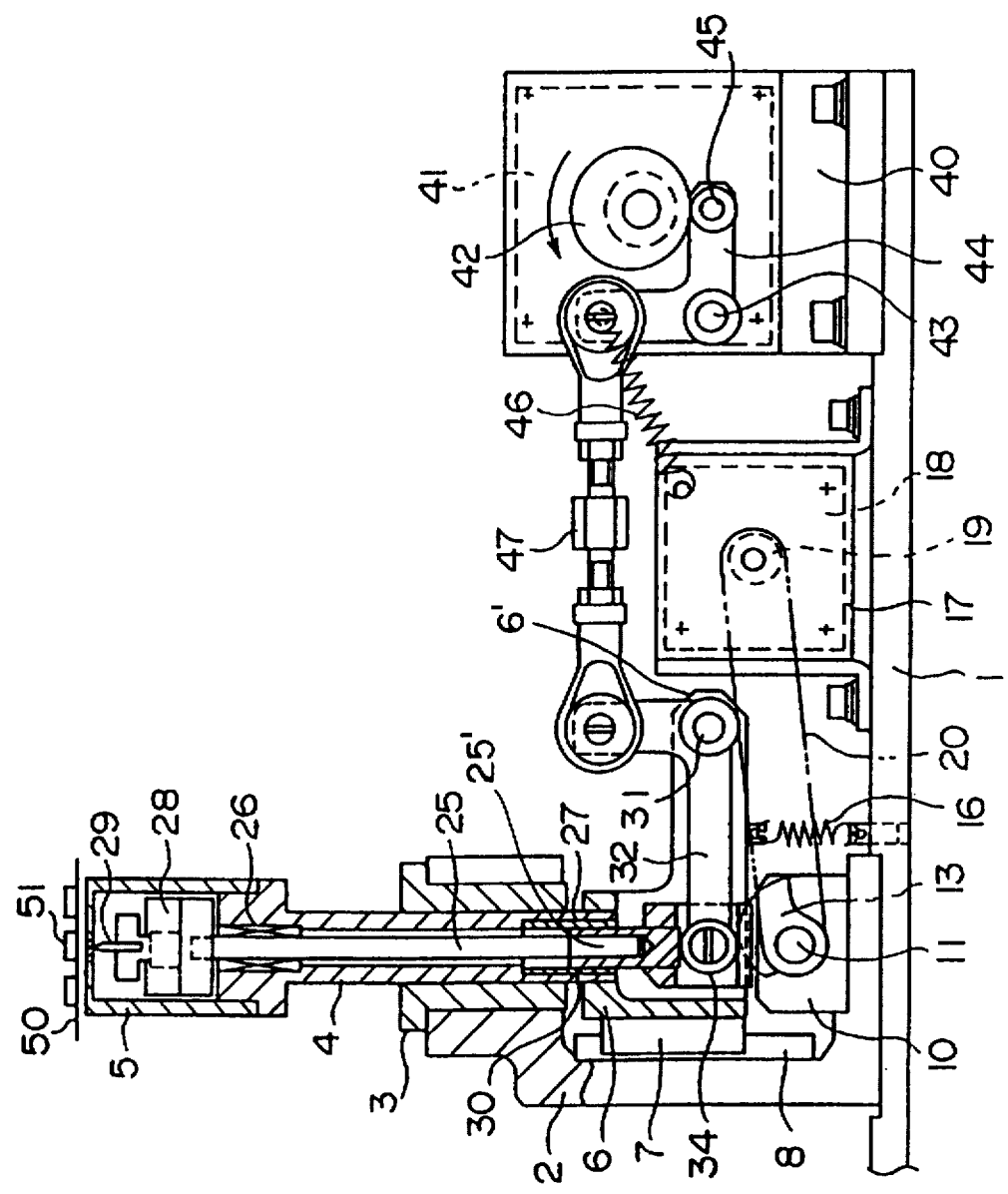

Below, a preferred embodiment of the present invention will be described with reference to FIGS. 1 through 3.

A C-shaped suction assembly holding body 2 is fastened to a base plate 1, and a suction assembly holder 4 is inserted into this suction assembly holding body 2 via a bearing 3 so that the suction assembly holder 4 can move up and down. A wafer sheet suction assembly (called "suction assembly") 5 which has suction holes and a push-up needle insertion hole formed in its upper surface is fastened to the upper end portion of the suction assembly holder 4. Vacuum suction is applied to the interior of the suction assembly 5 by a vacuum means (not shown) so as to hold the wafer sheet 50.

A raising-and-lowering holder 6 is fastened to the lower end portion of the suction assembly holder 4, and a guide 7 which is vertically oriented is provided on the raising-and-lowering holder 6. This guide 7 is fitted over a rail 8 which is fastened to the suction assembly holding body 2 in a vertical attitude, so that the guide 7 slides on the rail 8.

A cam shaft holder 10 is provided on the suction assembly holding body 2 so as to be located beneath the suction assembly holder 4. A cam shaft 11 is rotatably supported on this cam shaft holder 10 via bearings 12, and a suction assembly raising-and-lowering cam 13 and a timing pulley 14 are, as best seen in Figure(b), provided at both ends of this cam shaft 11.

A roller 15 is rotatably supported on the raising-and-lower holder 6 so as to be located on the suction assembly raising-and-lowering cam 13. The raising-and-lowering holder 6 is urged downward by a spring 16 so that the roller 15 is pressed against the suction assembly raising-and-lowering cam 13.

A suction assembly raising-and-lowering motor 18 is installed on the base plate 1 via a motor supporting plate 17. A timing belt 20 is provided between the timing pulley 14 and a drive pulley 19 coupled to the output shaft of the first motor 18.

A push-up needle raising-and-lowering shaft 25 is provided inside the suction assembly holder 4 via a ball bearing 26 and an oil-less bearing 27 so that the push-up needle raising-and-lowering shaft 25 is movable up and down.

A push-up needle holder 28 is attached to the upper end of the push-up needle raising-and-lowering shaft 25, and a push-up needle 29 is fastened to this push-up needle holder 28. Furthermore, a contact rod 25' is fastened to the lower end of the push-up needle raising-and-lowering shaft 25.

A supporting shaft 31 is fastened to the horizontal end 6a of the raising-and-lowering holder 6, and an L-shaped lever 32 which extends beneath the push-up needle raising-and-lowering shaft 25 is pivotally supported on this supporting shaft 31. A roller shaft 33 is fastened to one end (left end in FIG. 1(a)) of the L-shaped lever 32, and two rollers 34 and 35 are provided in a rotatable fashion on this roller shaft 33. A guide holder 36 is fastened to the lower end portion of the push-up needle raising-and-lowering shaft 25, and the lower end of the contact rod 30 is set to be in contact with the upper surface of the roller 34, and the guide holder 36 is set to be in contact with the undersurface of the roller 35.

A push-up needle raising-and-lowering motor 41 is installed on the base plate 1 via a motor supporting plate 40, and a push-up needle raising-and-lowering cam 42 is coupled to the output shaft of the push-up needle raising-and-lowering motor 41.

A supporting shaft 43 is fastened to the motor supporting plate 40, and an L-shaped lever 44 is pivotally supported on this supporting shaft 43. A roller 45 is rotatably provided at one end of the lever 44. The lever 44 is urged by a spring 46 so that the roller 45 is pressed against the push-up needle raising-and-lowering cam 42.

The upper end (in FIG. 1(a)) of the lever 32 and the upper end (in FIG. 1(a)) of the lever 44 are linked by a linking member 47 so that the levers 32 and 44 can pivot together. The linking member 47 is adjustable in its length.

Figure 2:
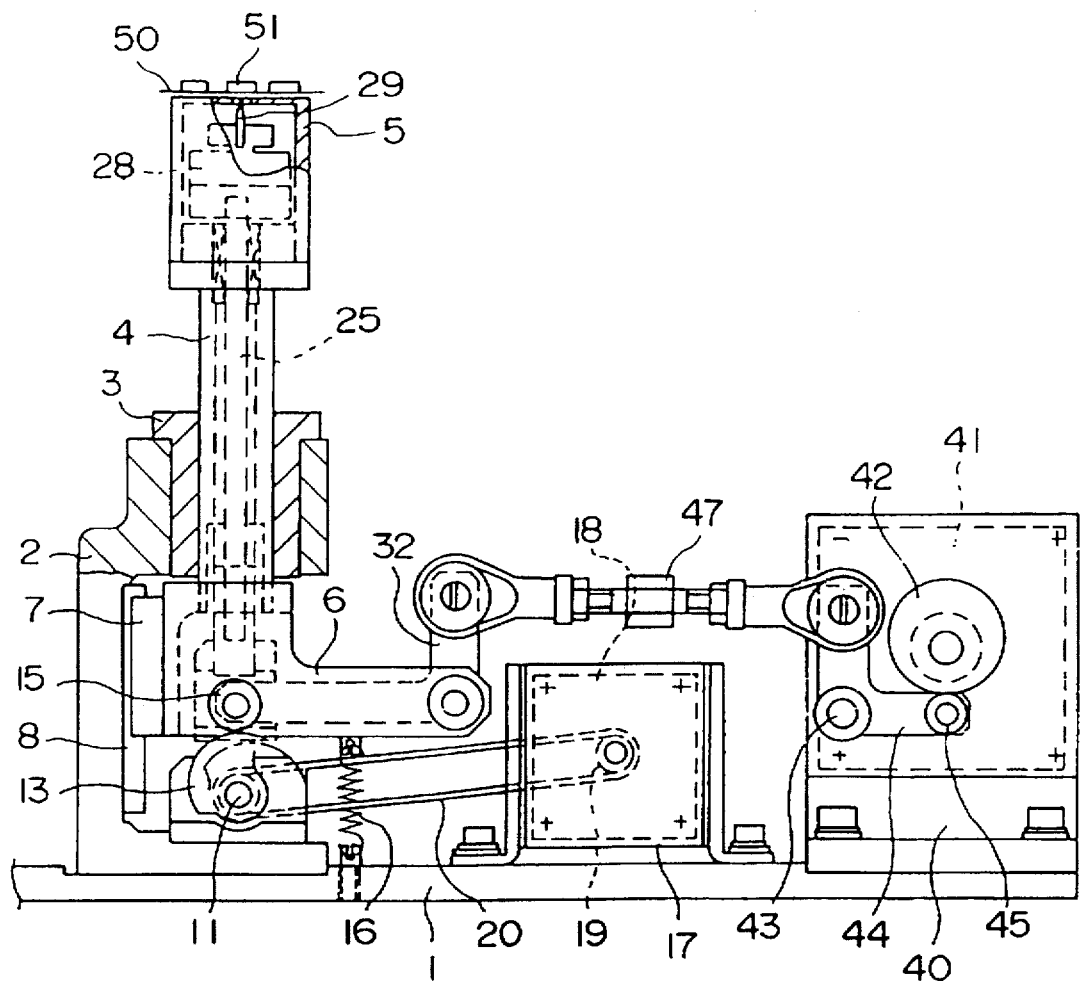
FIG. 2 is a partially sectional side view showing a state in which the suction assembly is raised.
Figure 3:
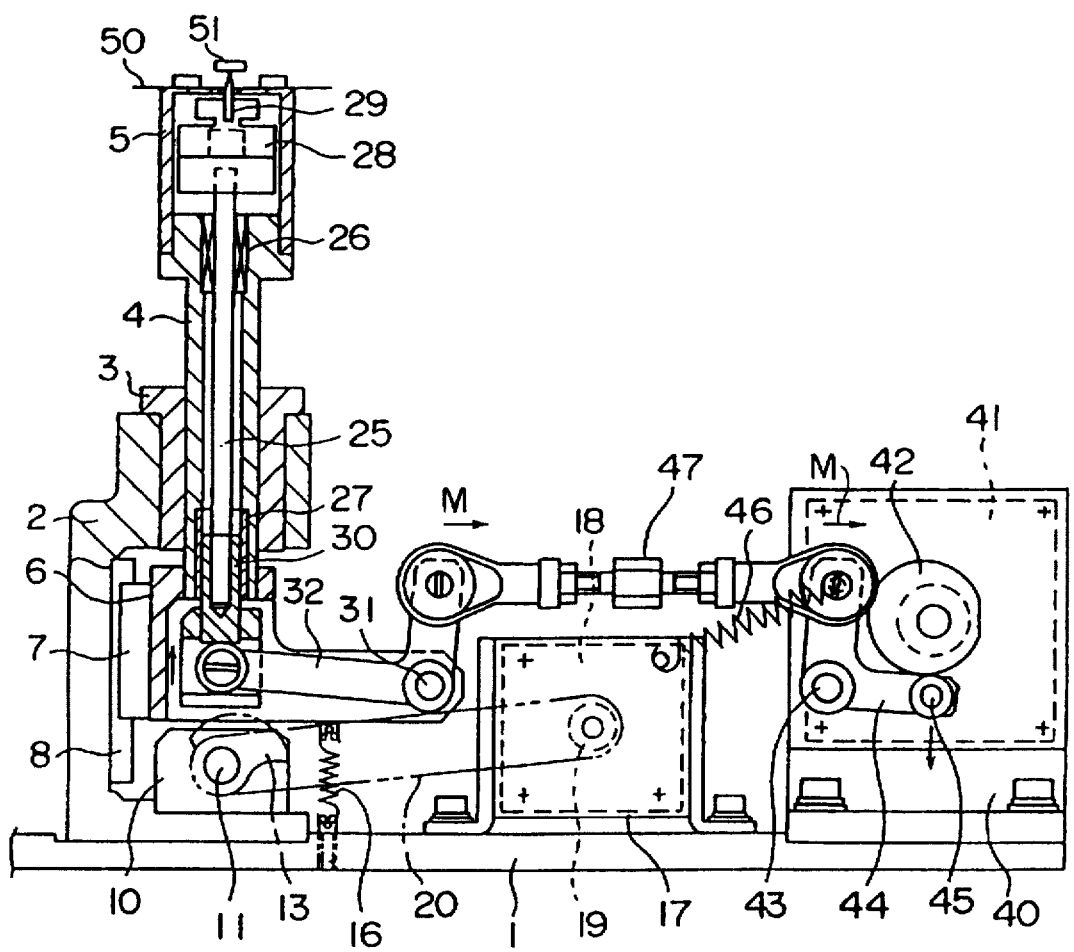
FIG. 3 is a sectional side view showing a state in which the push-up needle is lowered.

In FIGS. 1 through 3, the reference numeral 50 indicates a wafer sheet, and 51 indicates dies.

In operation, when the wafer ring of a semiconductor workpiece is automatically or manually attached to a wafer ring holder, and the die 51 that is to be picked up is positioned above the push-up needle 29, the suction assembly raising-and-lowering motor 18 is started. As a result, the cam shaft 11 is rotated via the timing pulley 19, timing belt 20 and timing pulley 14; and the suction assembly raising-and-lowering cam 13 is moved from the state shown in FIG. 1(a) into the state shown in FIG. 2, thus causing the roller 15 to be pushed upward.

The roller 15 is attached to the raising-and-lowering holder 6, and the raising-and-lowering holder 6 is fastened to the suction assembly holder 4; in addition, the suction assembly 5 is fastened to the suction assembly holder 4. Accordingly, the upward movement of the roller 15 causes the suction assembly 5 to move upward so as to come into contact with the undersurface of the wafer sheet 50. As a result, the wafer sheet 50 is held in place by vacuum suction of the suction assembly 5. At the same time, the suction chucking nozzle (not shown) is lowered so as to form a slight gap between the suction chucking part of the suction chucking nozzle and the die 51 that is to be picked up.

When the suction assembly 5 is thus moved upward, since the supporting shaft 31 of the lever 32 which drives the push-up needle 29 upward and downward is provided on the raising-and-lowering holder 6, the supporting shaft 31 is also raised when the raising-and-lowering holder 6 is moved upward as described above. As a result, the push-up needle 29 is moved up together with the suction assembly 5. In other words, even if the suction assembly 5 is moved upward or downward, the push-up needle 29 is not moved relative to the suction assembly 5. Accordingly, the up and down movement of the suction assembly 5 does not cause a protrusion of the push-up needle 29 above the upper surface of the suction assembly 5 nor a retraction of the push-up needle 29 into the suction assembly 5.

Next, the push-up needle raising-and-lowering motor 41 is actuated so that the push-up needle raising-and-lowering cam 42 is rotated. As a result, the roller 45 is pushed downward as shown in FIG. 3, and the lever 44 pivots in the clockwise direction about the supporting shaft 43. This movement causes the linking member 47 to be moved to the right as shown in arrow M, so that the lever 32 pivots in the clockwise direction about the supporting shaft 31, thus causing the rollers 34 and 35 to be pushed upward.

When the rollers 34 and 35 are thus pushed upward, the guide holder 36, push-up needle raising-and-lowering shaft 25, push-up needle holder 28 and push-up needle 29 are also moved upward. In other words, the die 51 is pushed up by the push-up needle 29, and the die 51 thus pushed upward is suction-chucked by the suction chucking nozzle.

When the push-up needle raising-and-lowering cam 42 is rotated even further, the roller 45 is moved upward (i. e., moved in the opposite direction from that described above). As a result, the die push-up device makes an operation in the opposite direction from that described above, and the push-up needle 29 is lowered.

Furthermore, the suction assembly raising-and-lowering motor 18 is rotated in the opposite direction from that described above, so that the suction assembly 5 and push-up needle 29 are both lowered (without any change in the relative positions of these element) by the operation of the push-up device operating in the opposite direction from that described above.

The wafer ring holder is next driven so that the next die 51 of the semiconductor workpiece that is to be picked up is positioned in the pick-up position, after which the operation is repeated.

As seen from the above, the suction assembly 5 is moved up and down by the suction assembly raising-and-lowering cam 13 which is rotated by the suction assembly raising-and-lowering motor 18; and the push-up needle 29 is moved up and down by the push-up needle raising-and-lowering cam 42 which is rotated by the push-up needle raising-and-lowering motor 41. Thus, the suction assembly 5 and the push-up needle 29 are independently operated.

In addition, since the suction assembly 5 is moved upward and downward when the suction assembly raising-and-lowering cam 13 is rotated by the suction assembly raising-and-lowering motor 18, the gap between the wafer sheet 50 and the suction assembly 5 can easily be adjusted.

Furthermore, when the wafer sheet 50 is moved in the X and Y directions or moved horizontally, the suction assembly 5 can be lowered; and when the push-up needle 29 is raised, the suction assembly 5 is brought into contact with the wafer sheet 50. Thus, the suction assembly 5 has no deleterious effect on the wafer sheet 50, and the suction holding capability of the suction assembly 5 is improved.

Furthermore, in the present invention, the suction assembly 5 is fastened to the suction assembly holder 4, and the raising-and-lowering holder 6 is also fastened to the suction assembly holder 4. The raising-and-lowering holder 6 is moved upward and downward by the suction assembly raising-and-lowering cam 13 which is rotated by the suction assembly raising-and-lowering motor 18. The push-up needle 29 is fastened to the push-up needle raising-and-lowering shaft 25 which is installed inside the suction assembly holder 4 so that the shaft 25 can move upward and downward, and this push-up needle raising-and-lowering shaft 25 is moved upward and downward by the lever 32 which is pivotally installed on the raising-and-lowering holder 6. This lever 32 is moved up and down by the push-up needle raising-and-lower cam 42 which is rotated by the push-up needle raising-and-lowering motor 41.

In other words, the supporting shaft 31 of the lever 32 which drives the push-up needle 29 upward and downward is provided on the raising-and-lowering holder 6. As a result, the supporting shaft 31 is moved up and down when the suction assembly 5 is moved vertically, so that the push-up needle 29 is moved upward and downward together with the suction attachment body 5. In other words, even if the suction attachment body 5 is moved upward and downward, the push-up needle 29 is prevented from being moved relative to the suction assembly 5. Accordingly, even if the suction assembly 5 should move upward or downward, there is no protrusion of the push-up needle 29 above the upper surface of the suction assembly 5 or retraction of the push-up needle 29 into the suction assembly 5.

As seen from the above, according to the present invention, a wafer sheet suction assembly and a push-up needle are operated independently by a suction assembly raising-and-lowering cam and a push-up needle raising-and-lowering cam which are respectively rotated by a suction assembly raising-and-lowering motor and a push-up needle raising-and-lowering motor. Accordingly, the vertical position of the suction assembly can easily be adjusted. Furthermore, the suction assembly has no deleterious effect on the wafer sheet during the movement of the wafer sheet, and the suction holding capability of the suction assembly is improved.

Furthermore, the suction assembly is provided on the suction assembly holder, the raising-and-lowering holder is provided on the suction assembly holder, the raising-and-lowering holder is moved vertically by a suction assembly raising-and-lowering cam which is rotated by a suction assembly raising-and-lowering motor, the push-up needle is attached to a push-up needle raising-and-lowering shaft installed inside the suction assembly holder so as to be moved upward and downward, the push-up needle raising-and-lowering shaft is moved upward and downward by a pivotal lever which is installed on the raising-and-lowering holder and is moved up and down by a push-up needle raising-and-lowering cam which is rotated by a push-up needle raising-and-lowering motor. Accordingly, even if the suction assembly is moved up and down, there is no shift in relative position between the suction assembly and the push-up needle.

I claim:

1. A die push-up device comprising a suction assembly, on which a wafer sheet to which dies are bonded is held by suction, and a push-up needle, which is installed inside said suction assembly and pushes said dies upward, said die push-up device being characterized in that said suction assembly and push-up needle are caused to move upward and downward independently by a suction assembly raising-and-lowering cam and a push-up needle raising-and-lowering cam which are respectively rotated by a suction assembly raising-and-lowering motor and a push-up needle raising-and-lowering motor.

2. A die push-up device comprising a suction assembly, on which a wafer sheet to which dies are bonded is held by suction, and a push-up needle, which is installed inside said suction assembly and pushes said dies upward, said die push-up device being characterized in that:

said suction assembly is provided on a suction assembly holder, a raising-and-lowering holder is fastened to said suction assembly holder so as to be moved upward and downward by a suction assembly raising-and-lowering cam which is rotated by a suction assembly raising-and-lowering motor, said push-up needle is provided on a push-up needle raising-and-lowering shaft which is installed inside said suction assembly holder so that said push-up needle raising-and-lowering shaft is moved upward and downward, said push-up needle raising-and-lowering shaft is moved upward and downward by a lever which is pivotally installed on said raising-and-lowering holder, and said lever is moved upward and downward by a push-up needle raising-and-lowering cam which is rotated by a push-up needle raising-and-lowering motor.

3. A die push-up device comprising a suction assembly for suction holding thereon a wafer sheet to which dies are bonded and a push-up needle provided in said suction assembly for pushing said dies so as to separate said dies from said wafer sheet, said device further comprising:

a suction assembly driving means for moving said suction assembly in one direction; and a push-up needle driving means for moving said push-up needle in said one direction, said push-up needle driving means functioning independently from said suction assembly driving means.

* * * * *